(12) United States Patent
Strozewski et al.

(10) Patent No.: US 6,783,904 B2
(45) Date of Patent: Aug. 31, 2004

(54) LITHOGRAPHY CORRECTION METHOD AND DEVICE

(75) Inventors: Kirk J. Strozewski, Round Rock, TX (US); Kevin D. Lucas, Austin, TX (US); Marc J. Olivares, New Braunfels, TX (US); Chi-Min Yuan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 172 days.

(21) Appl. No.: 10/150,564

(22) Filed: May 17, 2002

(65) Prior Publication Data

US 2003/0213613 A1 Nov. 20, 2003

(51) Int. Cl.⁷ .................................................. G03F 9/00
(52) U.S. Cl. ............................. 430/30; 716/19; 716/20
(58) Field of Search ............................ 430/30; 716/19, 716/20

(56) References Cited

U.S. PATENT DOCUMENTS

| 5,958,635 A | 9/1999 | Reich et al. |
| 6,120,952 A | 9/2000 | Pierrat et al. |
| 6,284,419 B2 | 9/2001 | Pierrat et al. |
| 6,319,644 B2 | 11/2001 | Pierrat et al. |

FOREIGN PATENT DOCUMENTS

EP 1164432 A1 12/2001

OTHER PUBLICATIONS

McCallum, Some Lithographic Limits of Back End Lithography, Nikon Precision Europe GmbH. Nikon Court, Kirkton Campus, Livingston EH54 7DL, UK, 8 pgs (2001).

*Primary Examiner*—Christopher G. Young
(74) *Attorney, Agent, or Firm*—Kim-Marie Vo; Robert L. King

(57) ABSTRACT

A method (10) for correcting lithography error includes generating (18) data that defines relationships between at least one predetermined design layout parameter and a known minimum required lithographic process capability (e.g. minimum feature spacing), and then using the data to upsize (30) predetermined isolated features or portions of predetermined isolated or semi-isolated features. In some embodiments, the resulting wafer circuit pattern (70) has isolated features (71, 72, 74) that are all larger than a predetermined minimum width. The upsized features are larger in the wafer circuit pattern (70) than they are drawn in a designed database. The method for correcting the lithography error, in some embodiments, is stored on a computer readable storage medium.

18 Claims, 3 Drawing Sheets

LITHOGRAPHY CORRECTION METHOD AND DEVICE

FIELD OF THE INVENTION

The invention relates generally to the field of semiconductors and more specifically to photolithography.

BACKGROUND OF THE INVENTION

As part of a semiconductor device manufacturing process, a photolithographic process is used to form a pattern in a photoresist layer on a semiconductor wafer by transferring light through a mask and lenses onto the photoresist layer. The pattern in the photoresist layer is transferred to an underlying layer (e.g., copper) on the semiconductor wafer to form a semiconductor device feature (e.g., an interconnect). However, the photolithography is a non-perfect pattern transfer process due to wave nature of light. Therefore, the patterns on the mask are often not transferred without error to the photoresist layer. Often this non-perfect pattern transfer results in smaller features than designed being printed, which is more severe for isolated features (features without other features in close proximity) than for dense features (features with other features in close proximity).

One proposed solution termed optical proximity correction (OPC) uses chosen lithographic process parameters (e.g., photoresist) so that the best overall result of dense and isolated features is achieved. To accommodate the processing problems, isolated features (or portions of isolated features) are enlarged relative to dense features (or portions of dense features) so that the isolated features print the width that they were designed to be. Therefore, the resulting pattern in the photolithographic process has the isolated features and dense features being the same width as they were designed. This can be achieved by enlarging the isolated features, decreasing the dense features or combinations of both. However, as semiconductor devices shrink, the designed width of features is often very difficult to pattern. Therefore, while OPC increases the ability to pattern isolated features, the ability to control etch processes and pattern small features in a photolithographic process is not sufficiently improved over using a photolithographic process without OPC.

Therefore, a need exists for a photolithographic process that allows for improved photolithographic patterning of isolated features and increased processing control of forming isolated and dense features in a sermiconductor manufacturing process.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Because OPC chooses a process based on the best resulting pattern of both dense and isolated (circuit) features using the process and then changes the widths of the isolated or dense features, the pattern formed on a photoresist layer is optimized for neither the dense feature nor the isolated features. Instead, embodiments of the present invention select a photolithographic process based on the best resulting pattern in a photoresist layer for the dense features and then upsize semi-isolated and isolated features. Therefore, the resulting pattern is optimized for the dense features and the isolated features are easily patterned based on their increased width. The isolated features are enlarged enough so that the resulting isolated features have dimensions that are greater than the dimensions of the isolated features as drawn in a design database. Various embodiments for a method for correcting lithography error and the resulting semiconductor device are better understood after turning to the drawings. As described below, the circuit features are interconnects (conductive lines), but the present invention is not limited to interconnects and can be used for any layer where isolated, semi-isolated, and dense features are present. For example, the circuit features can be isolation trenches, conductors, interconnects or vias.

As used herein, the term "isolated feature" is used to refer to a feature that is approximately a distance away from the next closest feature on all edges, wherein the distance is equal to or greater than approximately four times the minimum width of a feature on a semiconductor wafer. The term "dense feature" is used when referring to a feature that is approximately a distance away from the next closest feature on all edges, wherein the distance is approximately equal to the minimum width of a feature on a semiconductor wafer. As used herein, a "semi-isolated feature" is a feature that neither an isolated feature nor a dense feature. In one embodiment, the semi-isolated feature has an edge which is a distance away from the next closest feature, wherein the distance is greater than approximately the minimum width of a feature on the semiconductor wafer and is less than approximately four times the minimum width of a feature on the semiconductor wafer.

As used herein, the term "space" is used to refer to the distance between the edges of two circuit features. The term "pitch" refers to the distance between the centers of two circuit features. In other words, pitch includes the space between the two circuit features and half of the width of each feature.

Figure 1:
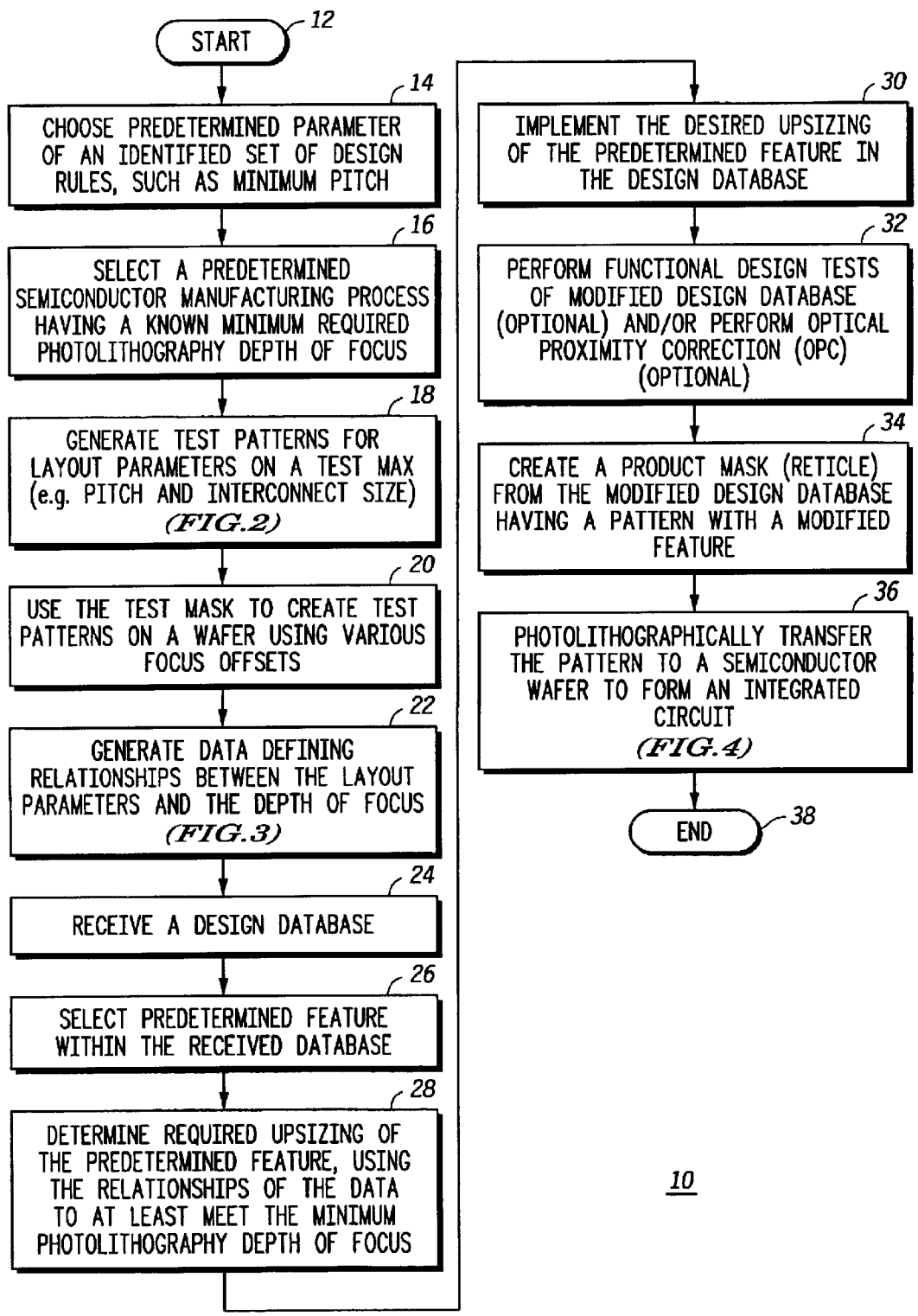
FIG. 1 illustrates a flow chart for selectively upsizing predetermined features in accordance with an embodiment of the present invention.

FIG. 1 shows a process flow 10 for forming a semiconductor device using a lithographic correction method in accordance with one embodiment of the present invention. The process flow 10 starts at step 12. First, predetermined parameters of an identified set of design rules are chosen in step 14. Typically, for each process flow a specific set of design rules, which provide instructions to be followed on how to or how not to design and layout specific areas of a semiconductor device, apply. For example, design rules may specify the minimum distance between two features (minimum pitch). (Typically, minimum pitch is defined as the distance from the middle of a feature to the middle of an adjacent feature.) In a preferred embodiment, the minimum pitch is chosen as the predetermined parameter.

A predetermined semiconductor manufacturing process having a known minimum required lithographic process capability is selected in step 16 either before or after step 14. In a preferred embodiment, the required lithographic process is a lithographic depth of focus. However, the required lithographic process can also be exposure latitude, mask sizing error tolerance, feature critical dimension (CD) control, feature edge roughness control, feature sidewall angle control, the like, and combinations of the above. The semiconductor manufacturing process includes a photolithographic process and may also include an etch process, a chemical mechanical deposition (CMP) process, or any other process used in semiconductor manufacturing process. The entire specific manufacturing process itself may not need to be selected and instead only important information for the process needs to be chosen or received. For example, the information can be minimum pitch or a desired depth of focus of a photolithographic process.

Figure 2:
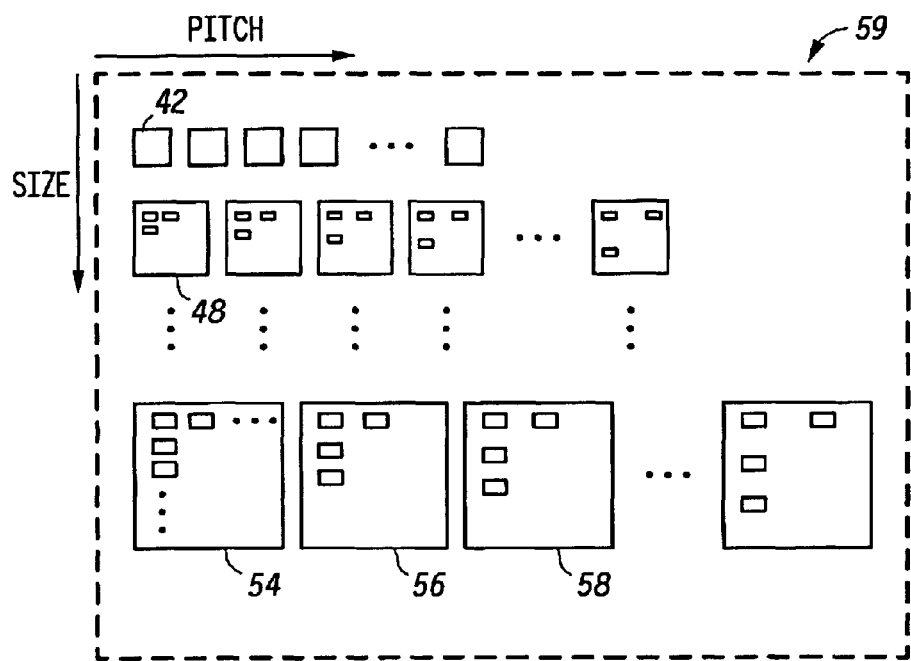
FIG. 2 illustrates a test pattern used to selectively upsize the predetermined features in accordance with an embodiment of the present invention.

Test patterns are generated in step 18 for various layout parameters on a test mask. In a preferred embodiment, the layout parameters are interconnect feature pitch value and interconnect feature width. One embodiment of a test pattern 40 on a mask is shown in FIG. 2. In the illustrated embodiment, the pitch value of test features are varied within each test pattern 54, 56 and 58. The plurality of test patterns 54, 56 and 58 are in the same row and the test features (e.g. lines) differ from among each test pattern 54, 56, and 58 in pitch (value). Thus, the test features in test pattern 56 are spaced apart farther from each other than the test features in test pattern 54, as shown in FIG. 2. In each column or vertical direction, the test patterns 42, 48 and 54 have test features that differ from each other in regards to the size of the test features in each test pattern. Thus, test pattern 54 has test features that are larger in size than the test features in test pattern 48. Hence, in the embodiment illustrated, the width of the test features increases in the negative y-direction and the pitch value of the test features increases in the positive x-direction. In different embodiment, the width and pitch can increase in different directions or different layout parameters can be used.

The test features form an array 59 on the test mask 40, which is used in step 20 to create test patterns on a wafer (semiconductor substrate) by varying a predetermined lithography variable. In a preferred embodiment, various focus offsets are used. (Other predetermined lithography variables that may be used include exposure energy offset and mask features size offset.) Various focus offsets are achieved by moving a stage that supports the wafer relative to a projection lens. By varying the focus offset, the test mask 40 is exposed with a range of focus positions. For example, the focus offsets are varied over a range so that the offset corresponds to values above the known minimum photolithography depth of focus. In one embodiment, the array 59 is patterned on a first area of a wafer using a first focal position (i.e. a first focus offset) and then the array 59 is patterned on a second area of a wafer (which in one embodiment is achieved by moving a wafer stage, which supports the wafer, in lateral and horizontal direction to a second focal position (i.e. a second focus 15' offset). The process can be repeated as desired to print the array 59 with a range of focal positions. All depths of focuses can be measured, however only the depths of focuses, which are above the minimum depth of focus, are needed.

Figure 3:
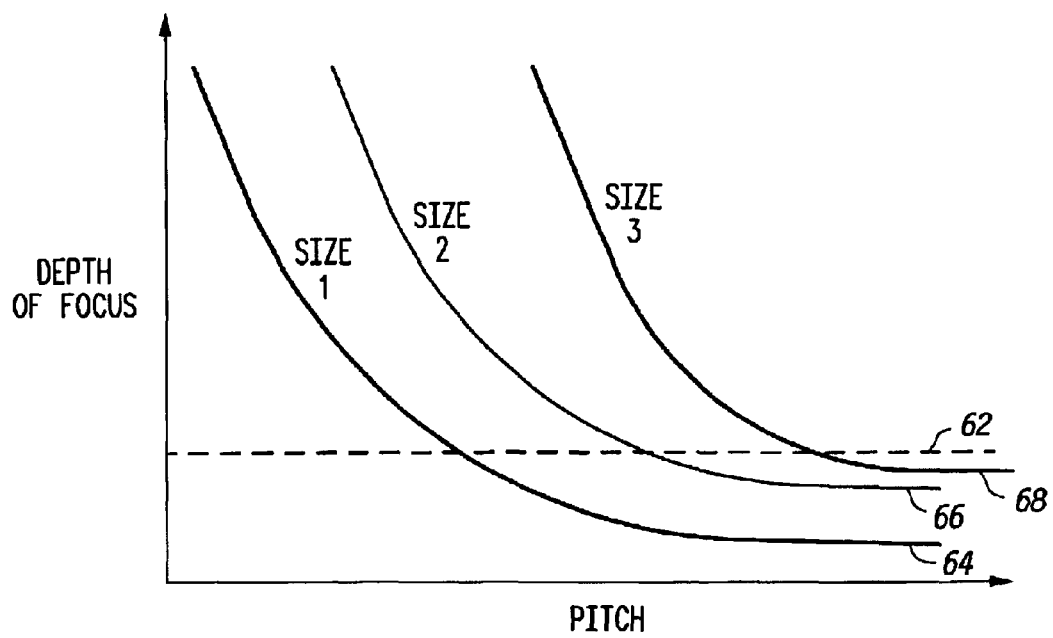
FIG. 3 illustrates a data defining relationships between layout parameters and the depth of focus in accordance with an embodiment of the present invention.

After step 20, data defining relationships between the layout parameters and the depth of focus is generated in step 22. In one embodiment, the data is generated into a graph of depth of focus versus pitch with varying widths, as shown in FIG. 3. For each width of the interconnect features the pitch between the interconnect features is plotted on the x-axis and the depth of focus is graphed on the y-axis. Curves 64, 66 and 68 illustrate different interconnect feature widths. Dashed line 62 is the minimum required depth of focus for the predetermined semiconductor manufacturing process selected in step 16. If the depth of focus below the minimum depth of focus 62 is not determined in step 20, then curves 64, 66 and 68 would not extend below the minimum required depth of focus 62 in FIG. 3. Although the data generated in step 22 is in the format of a graph, other formats can be used. For example, the data can be generated in a table, spreadsheet, chart, computer program, the like, or combinations of the above.

After step 22, a design database, which includes a pattern to be formed on a (semiconductor) wafer, is received in step 24. In one embodiment, the design database includes the design for at least one level of interconnect features. Predetermined features are selected from within the received database in step 26. In a preferred embodiment, the predetermined features are isolated interconnect features. However, the predetermined features could be semi-isolated interconnect features, dense features, or combinations of the above and isolated interconnect features. In addition, the predetermined features do not need to be interconnect features, they can be any feature on a semiconductor device. The predetermined feature is selected by choosing a feature that has a width that is equal to the minimum width of the design rules. Therefore, if an isolated feature (e.g. a bus line) has a designed width that is greater than the minimum width, then the isolated feature will not be the predetermined feature.

After step 26, the required upsizing of the predetermined feature using the relationships of the data to at least meet the minimum required photolithography depth of focus is determined in step 28. Determination of upsizing can be performed by a rule-based method or a simulation based method. In the former embodiment, the amount of increase in an edge of a circuit feature can be determined by using the graph shown in FIG. 3. In this embodiment, an isolated feature is the predetermined feature. Once the predetermined feature is identified, the pitch of the predetermined feature is determined, which can be performed in one embodiment by extracting the dimensions from the design database. The pitch of the desired feature is chosen from the x-axis (pitch) of FIG. 3. The corresponding width curve that intersects the minimum depth of focus 62 and the pitch intersection point, is a desirable width for the predetermined feature. If the width of the predetermined feature is not the desirable width, then the width of the predetermined feature needs to be adjusted. In a preferred embodiment, the desirable width is greater than the width of the predetermined feature. In another embodiment of rule-based determination for upsizing, the amount of upsizing of an edge of a circuit feature is determined used a bias table showing the amount of upsizing of an edge as a function of the size or width of the circuit feature and the space from an immediately adjacent circuit feature.

In another embodiment, a simulation-based method is used to determine the desired upsizing of an edge of a circuit feature. In this embodiment, a radius around a circuit feature is analyzed using known lithography simulation methods, such as Hopkins method to calculate light intensity.

With these known simulation methods a light intensity profile of the circuit feature during lithographic exposure is calculated. A table or a polynomial function is used to relate the amount of increase in an edge of a feature to parameters of the simulated light intensity around the edge. For example, the edge upsizing could be described as:

Edge upsizing=(I_minimum-I_dense)*Constant, where I_minimum is the minimum light intensity calculated within a radius around the circuit feature edge, I_dense is the simulated minimum light intensity between two features patterned at the minimum pitch, and Constant is a real number determined empirically.

In another embodiment, a second simulation-based method is used to determine the desired upsizing of an edge of a circuit features. The second simulation-based method is a lithography simulation-based method used to determine the expected process latitude (such as depth of focus) of a circuit feature. Resimulation of successively expanded circuit features edges is performed until the simulated process latitude of the circuit feature meets the minimum lithographic requirements. A table or a polynomial function may be used to relate the expected process latitude at a circuit feature to parameters of the simulated light intensity around that feature. For example, the depth of focus could be described as:

Depth of focus=I_average*Constant, where I_average is the average lithographic exposure light intensity calculated within a radius around the circuit feature, and Constant is a real number determined empirically. If the depth of focus does not meet the minimum required depth of focus, a simulation is performed in which some or all of the feature's edges are upsized and then the depth of focus is recomputed. This procedure repeats until the depth of focus meets the minimum required depth of focus for the feature. Thus, the desired edge upsizing of the circuit feature becomes known.

After step 28, the desired upsizing of the predetermined features is implemented in the design database in step 30 to form a modified design database. In a preferred embodiment, upsizing is performed by a computer that also performed step 28. The computer uses standard edge movement design techniques (e.g. edge sizing operations) to implement the known desired feature upsizings computed in step 28. In another embodiment, manual modification of the width of the predetermined feature is performed.

After step 30, functional design tests of the modified design database and/or optical proximity correction (OPC) is performed in step 32. However, this step is optional and neither functional design tests nor OPC may be performed. Functional design tests may include checking the modified design database for compliance with the identified set of design rules or with circuit timing requirements. OPC can be performed as is known to one of ordinary skill in the art and may result in adding optical proximity correction feature(s) to the modified design database.

A product mask (reticle) is created from the modified design database in step 34. The product mask has a pattern with features that are modified from the design database. In one embodiment, all of the isolated devices are upsized.

The product mask created in step 34 is used to photolithographically transfer the pattern on the product mask to (a photoresist layer formed over) a semiconductor wafer to form an integrated circuit in step 36.

Figure 4:
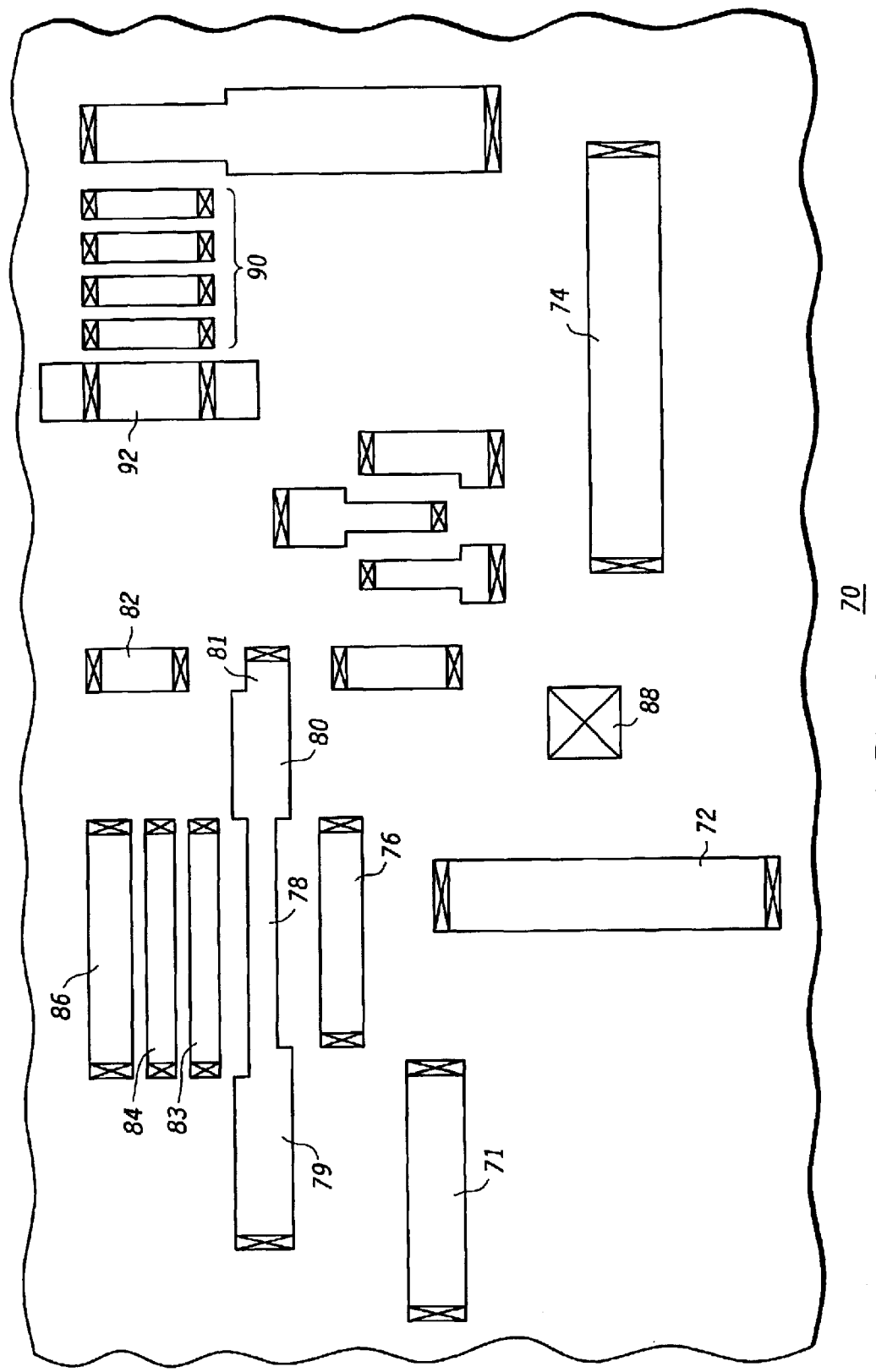
FIG. 4 illustrates a semiconductor wafer formed using an embodiment of the present invention.

A portion of an integrated circuit that is formed over or within a semiconductor wafer having a wafer circuit pattern 70 is formed using the product mask as shown in FIG. 4. All the circuit features shown in FIG. 4 are interconnect features and the "X"s shown on the circuit features illustrates where vias may be formed below or above the interconnects. (A skilled artisan recognizes that the wafer circuit pattern 70 shown in FIG. 4 is an example and non-limiting. For example, other patterns, layouts or circuit features may be used.)

The wafer circuit pattern 70 has a plurality of circuit feature each having a width equal to a critical dimension value (i.e. the minimum width) and isolated features that have a width that is not equal to the minimum feature width. In some embodiments, the isolation features are upsized approximately 20%, or more specifically substantially between 20–50% in size (area) or width in the wafer circuit pattern relative to drawn dimension in the database design. In some embodiments, the semi-isolated features are upsized in the wafer circuit pattern to be at least approximately 10% of the minimum feature width or more preferably substantially between 10–25% of the minimum feature width in size or width relative to drawn dimensions. For example, if the drawn dimension is 100 microns squares and the resulting size in the wafer circuit pattern is 120 microns squares then the size has increased by 20%. A description of the desired upsizing or the absence of upsizing is described below in more detail in regards to specific isolated, semi-isolated, and dense features.

All edges of a first isolated feature 71, a second isolated feature 72 and a third isolated feature 74 have been upsized (increased) as compared to the dimensions of the first isolated feature 71, the second isolated feature 72 and the third isolated feature 74 in the design database resulting in at least substantially 20% or more specifically, between substantially 20–50% increase in size (area). However, it is not necessary that the first isolated feature 71, the second isolated feature 72 and the third isolated feature 74 be increased the same amount. For example, the third isolated feature 74 may be increased more than the first isolated feature 71, because the first isolated feature 71 is closer to another feature than the third isolated feature 74.

In one embodiment, a fourth isolated feature 88 is not increased in width as compared to the width of the fourth isolated feature 88 in the design database because the width of the fourth isolated feature 88 was large enough (i.e. the width of the fourth isolate feature 88 was greater than approximately the minimum width of a feature on the semiconductor wafer). Thus, in at least one embodiment the wafer circuit pattern has a first plurality of on-wafer circuit feature edges having a separation distance to other circuit feature equal to a minimum feature space that may be implemented in the wafer circuit pattern and a second plurality of on-wafer circuit feature edges in which at least a portion is isolated from all other circuit features in the wafer circuit pattern by at least four times the minimum feature space. In addition, the second plurality is opposite a feature edge that is within the minimum feature space of another edge and each of the second plurality of on-wafer circuit feature edges is moved outward from a feature center thereof to form a feature width that is at least one hundred and ten percent of a minimum feature width. In one embodiment, the minimum feature width is equal to the minimum feature space. Additionally, in some embodiments, for each feature having an edge within the second plurality of on-wafer circuit feature edges, all edges that are not within the minimum feature space of another feature edge are extended to result in a feature with first and second portions have different widths.

Dense features 84 and 83 are also not increased in width and, in one embodiment, are the minimum width (critical dimension) and minimum pitch. The dense features 84 and 83 are considered dense, and therefore are not increased in width.

A first semi-isolated feature 76 is moderately increased in width compared to its width in the design database because of its close proximity to the dense portion 78. However, the dense portion 78 is not increased in width because it is a dense portion (i.e. this portion of the interconnect meets the requirements to be a dense feature). The first isolated portion 79 and the second isolated portion 80 are treated as isolated features and therefore are increased in width. As shown in FIG. 4, notch 81 is enlarged is treated as a semi-isolated feature and only a portion of it is upsized due to the close proximity of a fifth isolated feature 82.

A portion of a second semi-isolated feature 86 is increased in size. The edge not immediately adjacent the dense feature 84 is moved (extended) to upsize the second semi-isolated feature 86. In other words, the semi-isolated feature has a first portion adjacent the dense features 84 and is separated by substantially the minimum feature width and a second portion positioned more than the minimum feature width from any other circuit features (isolated, semi-isolated or dense) and the distance between the first portion and the second portion is a width that has been upsized at least approximately 10%. A third semi-isolated feature 92 is increased in size on the three edges that are not immediately adjacent the dense features 90. For the second semi-isolated feature 86 and the third semi-isolated feature 92 either one, two or three sides that are not immediately the adjacent dense features 84 or 90 can be increased. In other words, the upsizing used for the second semi-isolated feature 86 or the third semi-isolated feature 92 are interchangeable. Upsizing all sides of a semi-isolated feature except those that are immediately adjacent a dense feature (i.e. are a minimum spacing away from a dense feature) may be an easier process to implement because it may be simpler to write a computer program that can automatically determine which edges to expand to create a larger semi-isolated feature.

Dense features 90 are similar to dense features 83 and 84 and, therefore, are not upsized. A second semi-isolated feature 92 is increased in size on the three edges that are not immediately adjacent the dense features 90. Only the edges that are greater than approximately 4 times the width of a minimum feature are increased because the edge immediately adjacent the dense features 90 is spaced at the minimum spacing from the dense features 90. No spacing should be less than the minimum spacing, because the minimum spacing is the smallest spacing a chosen process can reliably form.

After step 36, the process flow 10 for correcting a lithography error ends at step 38. Further processing known to one skilled in the art may be used to add additional layers and functionality to the semiconductor wafer.

The process flow 10 correcting a lithography error can be performed manually or by a computer. In one embodiment, a CAD program implements the process flow 10 and all data and programming may be stored in a computer-readable medium. For example, the data defining relationships performed in step 22 can be a spreadsheet or database in a computer-readable medium.

A skilled artisan should appreciate that the present invention is not limited by the photolithographic process used. For example, the present invention may utilize 248 nm, 193 nm, 157 nm, extreme ultra violet (EUV), or any other photolithographic technology.

As should be appreciated by now, upsizing isolated or semi-isolated features so that the resulting features on a semiconductor wafer are larger than the size of the features in the design database allows for increased depth of focus control of the features. Therefore, the isolated and semi-isolated features can more controllably be patterned. In addition, the upsizing of the features on the semiconductor wafer allows for increased process margin because the features are larger and, thus, easier to process. Improved process margin desirably leads to increased yield. By not modifying the dense features and choosing a process based solely on the dense features allows for improved processing of dense features. The upsizing of the on-wafer dimensions of isolated features also allows for optimization of the reticle manufacturing for improved processing of dense feature. In addition, the upsizing of the on-wafer dimensions of isolated features reduces optical proximity effects, such as line-end pullback. Therefore, the need for complex optical proximity correction is reduced.

In the foregoing specification, the invention has been described with reference to specific embodiments. However, one of ordinary skill in the art appreciates that various modifications and changes can be made without departing from the scope of the present invention as set forth in the claims below. Although pitch value and size were chosen as layout parameters any other layout parameters may be chosen. Additionally, although data is generated in step 22 between two layout parameters, and the depth of focus, any number of layout parameters (i.e. at least 1 layout parameter) can be chosen and used to generate data with any known minimum required lithographic process capability. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for correcting lithography error, comprising:

choosing one or marc predetermined parameters of a predetermined set of design rules;

selecting a predetermined semiconductor manufacturing process having a known minimum required lithographic process capability;

generating data that defines relationships between at least one predetermined design layout parameter and the known minimum required lithographic process capability;

receiving a design database;

selecting a predetermined feature within the received database;

determining any desired upsizing of the predetermined features by using the data to ensure that the known minimum required lithographic process capability is met for the predetermined feature;

implementing any desired upsizing of the predetermined feature in the design database to form a modified design database;

creating a product mask from the modified design database having a pattern with a modified feature; and photolithographically transferring the pattern to a semiconductor wafer to form an integrated circuit.

2. The method of claim 1 further comprising:

prior to generating the data that defines relationships between at least one predetermined design layout parameter and at least one lithographic process parameter, generating test patterns for various layout parameters on a test mask; and creating a plurality of test patterns on a wafer with the test mask by using at least one predetermined process offset over a range located above the known minimum required lithographic process capability.

3. The method of claim 1 wherein the creating the plurality of test patterns further comprise:

creating each of the plurality of test patterns for a predetermined feature size and a predetermined pitch value of two adjacent features.

4. The method of claim 2 wherein the generating of data that defines relationships between at least one predetermined design layout parameter and the at least one lithographic process parameter further comprises generating at least one graph defining a minimum feature size for a predetermined minimum required lithographic process capability and a predetermined pitch value of two adjacent features.

5. The method or claim 2 wherein the at least one predetermined process offset comprises a parameter selected from the group consisting of focus offset, exposure energy offset and mask feature size offset.

6. The method of claim 1 wherein the known minimum required lithographic process capability comprises at least one of lithographic depth of focus, exposure latitude, mask sizing error tolerance, feature critical dimension (CD) control, feature edge roughness control and feature sidewall angle control.

7. The method of claim 1 wherein selecting a predetermined feature within the received database further comprises selecting an interconnect as the predetermined features.

8. The method of claim 1 wherein the implementing of any desired upsizing of the predetermined features in the design database further comprises upsizing of the predetermined features in the design database by at least twenty percent or more in size.

9. The method of claim 1 wherein the implementing of any desired upsizing of the predetermined features in the design database further comprises upsizing of the predetermined features in the design database somewhere in a range of between substantially twenty percent to fifty percent in size.

10. The method of claim 1 further comprising:

performing functional design tests of the modified design database prior to creating the product mask.

11. The method of claim 1 further comprising:

adding an optical proximity correction feature to the modified design database prior to creating the product mask to further minimize lithography error.

12. The method of claim 1, wherein determining any desired upsizing of the predetermined features further comprises choosing one or more predetermined parameters of the simulated lithographic exposure light intensity of the predetermined semiconductor manufacturing process.

13. The method of claim 12 wherein the at least one lithographically simulated light intensity parameter comprises a parameter selected from the group consisting of minimum light intensity, maximum light intensity, average light intensity, slope of the light intensity, and slope of the logarithm of the light intensity.

14. A computer readable storage medium for storing a method for correcting lithography error, comprising:

means for choosing one or more predetermined parameters of a predetermined set of design rules;

means for receiving information about a predetermined semiconductor manufacturing process including a known minimum required lithographic process capability;

means for generating data that defines relationships between at least one predetermined design layout parameter and the known minimum required lithographic process capability;

means for receiving a design database;

means for selecting predetermined features within the received database;

means for determining any desired upsizing of the predetermined features by using the data to ensure that the known minimum required lithographic process capability is met for the predetermined features; and means for implementing any desired upsizing of the predetermined features in the design database to form a modified design database.

15. The computer readable storage medium of claim 14 further comprising:

means for generating test patterns for various layout parameters for use on a test mask prior to generating the data that defines relationships between at least one predetermined design layout parameter and at least one lithographic process parameter.

16. The computer readable storage medium of claim 14 wherein the means for implementing any desired upsizing of the predetermined features in the design database further comprise means for upsizing the predetermined features in the design database somewhere in a range of between substantially twenty percent to fifty percent in size.

17. The computer readable storage medium of claim 14 further comprising:

means for adding an optical proximity correction feature to the modified design database to further minimize lithography error.

18. The computer readable storage medium of claim 14 further comprising:

means for performing functional design tests of the modified design database.

* * * * *

UNITED STATES PATENT AND TRADEMARK OFFICE
CERTIFICATE OF CORRECTION

| | | |
|---|---|---|
| PATENT NO. | : 6,783,904 B2 | Page 1 of 1 |
| APPLICATION NO. | : 10/150564 | |
| DATED | : May 17, 2002 | |
| INVENTOR(S) | : Kirk J. Strozewski et al. | |

It is certified that error appears in the above-identified patent and that said Letters Patent is hereby corrected as shown below:

In Column 8, Line 48, Claim No. 1:

Change "marc" to --more--

Signed and Sealed this

Eighteenth Day of December, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,783,904 B2 | Page 1 of 1 |
| APPLICATION NO. | : 10/150564 | |
| DATED | : August 31, 2004 | |
| INVENTOR(S) | : Kirk J. Strozewski et al. | |

It is certified that error appears in the above-identified patent and that said Letters Patent is hereby corrected as shown below:

In Column 8, Line 48, Claim No. 1:

Change "marc" to --more--

This certificate supersedes the Certificate of Correction issued December 18, 2007.

Signed and Sealed this

Eighth Day of January, 2008

JON W. DUDAS
*Director of the United States Patent and Trademark Office*